(12) United States Patent
Ransijn

(10) Patent No.: US 6,392,457 B1
(45) Date of Patent: May 21, 2002

(54) SELF-ALIGNED CLOCK RECOVERY CIRCUIT USING A PROPORTIONAL PHASE DETECTOR WITH AN INTEGRAL FREQUENCY DETECTOR

(75) Inventor: Johannes Gerardus Ransijn, Wyomissing Hills, PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/677,469

(22) Filed: Oct. 2, 2000

(51) Int. Cl.[7] ................................................. H03L 7/06
(52) U.S. Cl. ..................... 327/156; 327/12; 327/141; 327/23; 327/231
(58) Field of Search ................................ 327/141, 551, 327/159, 150, 12, 154, 39, 24, 23, 231; 375/361, 376

(56) References Cited

U.S. PATENT DOCUMENTS

| | | | | |
|---|---|---|---|---|
| 4,575,860 A | * | 3/1986 | Scordo ........................ 327/231 |
| 4,902,920 A | * | 2/1990 | Wolaver ....................... 327/12 |
| 5,694,088 A | | 12/1997 | Dickson ....................... 331/12 |
| 5,757,857 A | * | 5/1998 | Buchwald .................... 375/271 |
| 6,087,902 A | | 7/2000 | Larson ......................... 331/25 |
| 6,091,304 A | | 7/2000 | Harrer ......................... 331/10 |

OTHER PUBLICATIONS

J.A. Afonso, A.J. Quiterio, D.S. Arantes, "A phase-locked loop with Digital Frenquency comparator for Timing Signal Recovery" National Telecom. Conf. Rec. paper 14.4, 1979.

* cited by examiner

*Primary Examiner*—Dinh T. Le
(74) *Attorney, Agent, or Firm*—Wendy W. Koba

(57) ABSTRACT

A clock recovery circuit includes a sampling phase detector and frequency detector. The sample values generated in the phase detection portion of the clock recovery circuit and applied as inputs to the frequency detector to allow for frequency "cycle slips" to be detected and corrected without requiring the use of a separate circuit.

16 Claims, 7 Drawing Sheets

ALEXANDER PHASE DETECTOR

SAWTOOTH PHASE DETECTOR

SELF-ALIGNED CLOCK RECOVERY CIRCUIT USING A PROPORTIONAL PHASE DETECTOR WITH AN INTEGRAL FREQUENCY DETECTOR

TECHNICAL FIELD

The present invention relates to a clock recovery circuit and, more particularly, to clock recovery circuit comprising a self-aligned proportional phase detector (SAPPD) including an integral frequency detection.

BACKGROUND OF THE INVENTION

Clock recovery circuits are employed within optical and RF receivers to establish synchronization between a locally generated clock and the timing of a bit stream within a received data signal. The local clock, once synchronized to the incoming data signal, is used to control regeneration of the data. In most cases, a phase-locked loop (PLL) circuit is used to provide clock recovery.

A phase locked loop (PLL) is a system that uses feedback to maintain an output signal in a specific phase relationship with a reference signal. PLLs are used in many areas of electronics to control the frequency and/or phase of a signal. These applications include frequency synthesizers, analog and digital modulators and demodulators, and clock recovery circuits.

A typical prior art PLL includes a phase detector, a loop filter, and a voltage-controlled oscillator (VCO). The phase detector produces an output voltage that is proportional to the phase difference between an input signal and the output of the VCO. The loop filter integrates the output of the phase detector and creates a VCO control signal. The VCO produces an ac output signal having a frequency that is proportional to the VCO control voltage.

With conventional phase locked loops, difficulties are presented when attempting to phase lock to high frequency input signals. For example, the synchronous optical network (SONET) standard specifies that a 622 MHz PLL should have a loop bandwidth of between 250–500 kHz. Unfortunately, a standard PLL can only "pull-in" an input signal that is within about a loop bandwidth of the nominal frequency. In the above example, this means that a SONET standard PLL has a "pull in" range of about ±0.04% to about ±0.08%. Techniques for extending the frequency lock range of a PLL circuit based on sampled phase detectors utilize a square wave as an auxiliary input to initially tune the VCO, while using an additional phase and frequency detector (PFD) to compare the frequency of the auxiliary input to the VCO output. Once the VCO is tuned to the desired frequency in this manner, the additional PFD is switched out of the PLL feedback loop and the sampled phase detector is utilized to phase lock onto the incoming data. However, relying on the presence of an external reference signal (such as a square wave) to extend the frequency lock range may not be practical in many receiver applications where the only received signal is the incoming random data.

A problem exists, however, for a PLL circuit that utilizes a sampled phase detector. Specifically, for large frequency errors, conventional sampled phase detectors are equally likely to generate a positive or negative phase correction signal, regardless of the actual polarity of the frequency error, since the likelihood of sampling before and after a data edge (due to the frequency error) is fifty percent (50%). Thus, it is necessary to ensure that large frequency errors do not occur by extending the frequency lock range of a PLL circuit.

Thus, a need remains in the art for any arrangement for providing the desired frequency detection within a clock recovery circuit utilizing a sampled phase detector without the need for a separate frequency detection circuit.

SUMMARY OF THE INVENTION

The need remaining in the prior art is addressed by the present invention, which relates to a clock recovery circuit and, more particularly, to a clock recovery circuit comprising a self-aligned proportional phase detector (SAPPD) including an integral frequency detection.

In accordance with the present invention, the data sample outputs generated by the SAPPD are used as inputs to a frequency detection circuit. The clock signals are used to form a pair of quadrature clock signals at a subclock frequency of $f_1-f_2$, thus defining four quadrants in a cycle of the subclock frequency. A "cycle slip" is then determined based on the data samples, and the frequency adjusted on an UP/DOWN basis, depending upon in the quadrant in which the cycle slip occurs.

Other and further aspects and features of the present invention will become apparent during the course of the following discussion and by reference to the accompanying drawings.

BRIEF DESCRIPTION OF THE DRAWINGS

Referring now to the drawings.

DETAILED DESCRIPTION

In order to fully understand and appreciate the frequency detection capability of the present invention, it is useful to review the workings of a prior art clock recovery circuit based on a sampling phase detector, as well as a self-aligned proportional phase detector.

Figure 1:
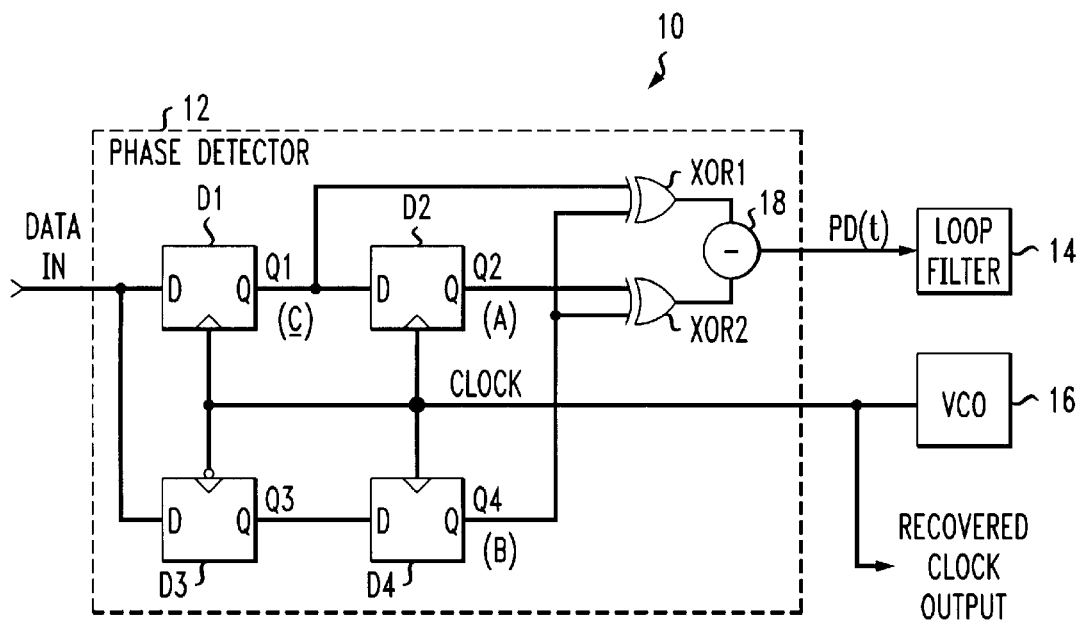
FIG. 1 a prior art clock recovery circuit including a sampling phase detector.

Referring to FIG. 1, a prior art clock recovery circuit 10 includes a sampling phase detector 12 responsive to an input data signal ("DATA$_{IN}$"), a loop filter 14 and a voltage-controlled oscillator (VCO) 16 that provides a recovered clock output based on DATA$_{IN}$. Clock recovery circuit 10 functions to synchronize the VCO clock output with the symbol-to-symbol timing of DATA$_{IN}$. Phase detector 12 is comprised of four sampling circuits (e.g., D-type flip-flops) D1–D4, a pair of exclusive OR gates XOR1,XOR2 and a subtractor 18 which is used to subtract the output of XOR1 from the output of XOR2. Phase detector 12 is known in the art as the "Alexander" phase detector and is widely used in conventional high-speed clock recovery circuits, and is fully described in an article entitled "Clock Recovery from Random Binary Signals" by J. D. H. Alexander, appearing in *Electronics Letters*, Vol. 21, pp. 541–2, 1975.

In operation, a data signal to be regenerated (DATA$_{IN}$) is received at the D inputs of sampling circuits D1 and D3. The data signal is typically a bit stream of non-return-to-zero (NRZ) data. Sampling circuits D1–D4 may each be embodied as a simple clocked D-type flip-flop, preferably including an internal comparator at the D input of the flip-flop. The comparator is used to compare the amplitude of the input signal at the clocked sampling instant to a decision threshold to determine if the sample is closer to a logic "0" or a logic "1". The logic level at the input of sampling circuits D1 and D3 is transferred to the Q output and held there until the next clock cycle transition (positive transition for circuits D1, D2 and D4, a negative transition for D3) appears at the clock input port. Without the internal comparator in the D1 and D3 circuits, a typical clocked D flip-flop would provide an indeterminate output for data signal levels at the zero-crossings between bits.

Figure 2:
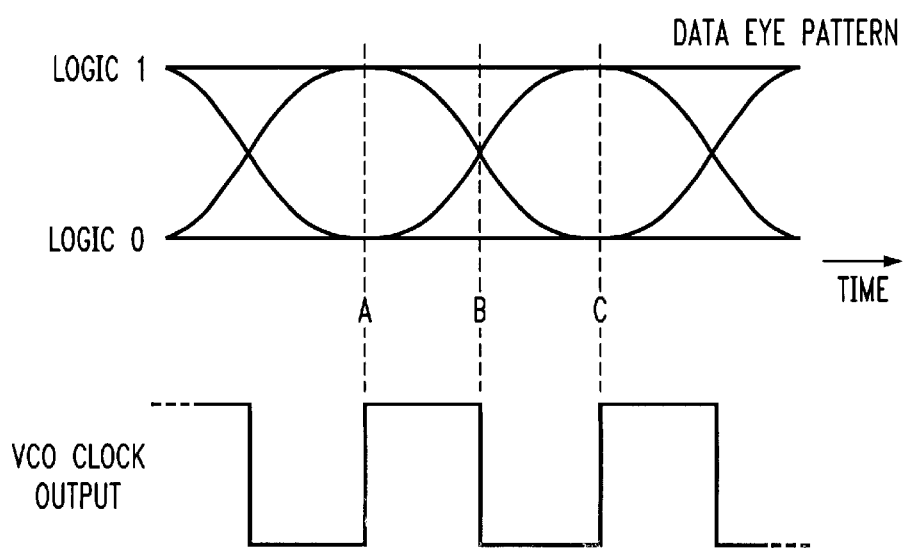
FIG. 2 contains an illustrative eye pattern for the data input signal associated with the recovery circuit of FIG. 1.

FIG. 2 shows an illustrative eye pattern for the input data signal in relation to an aligned VCO clock output. Sampling points A and C on the eye pattern represent the midpoints of two consecutive bits of the data signal. Data samples will be taken at these points if the clock is precisely aligned with the data timing. Sample point B is at the crossover point (zero crossing) between successive bits if the clock is perfectly aligned. Therefore, if there is no data transition between consecutive sampling points A and C (i.e., if the A and C samples are at the same logic level), then the B sample is at the same logic level as the A and C samples. If there is a data transition and the clock is slightly early, the B sample is taken prior to the crossover time and will thus equal the logic level of the A sample. Conversely, if the clock is slightly late during a data transition, the B sample will equal the logic level of the C sample.

Referring still to FIGS. 1 and 2, sampling circuits D1, D2 and D4 are clocked together by the clock output of VCO 16 and sample the D input at the leading edge of the clock pulse. Sampling circuit D3 samples the D input at the trailing edge of the clock. Since the output Q1 of sampling circuit D1 is applied as the D input to sampling circuit D2, and the output Q3 of D3 sampling circuit D4, sampling circuit D1 stores the most recent bit (i.e., bit C); sampling circuit D2 stores the previous bit (i.e., bit A); and D4 stores the crossing point sample (i.e., bit B). That is, the local level of the zero crossing sample B appears at output Q4 of circuit D4 at the same time that logic levels of samples A and C appear on outputs Q2 and Q1, respectively.

By comparing the value of Q4 with the values of Q1 and Q2, it can be determined whether the clock is "early" or "late" as follows:

If A=B≠C, then clock is "early" (E)

If A≠B=C, then clock is "late" (L)

If A=B=C., or A=C≠B, then no decision is possible.

These four conditions are detected by applying the B and C samples to exclusive OR gates XOR1 applying the A and B samples to gate XOR2, and then subtracting the output of XOR1 from XOR2 using analog subtractor 18. The following truth table depicts the detection conditions:

| A | B | C | A ⊕ B XOR2 | B ⊕ C XOR1 | Decision | A ⊕ B − B ⊕ C PD(t) |
|---|---|---|---|---|---|---|
| 0 | 0 | 0 | 0 | 0 | X | 0 |
| 0 | 0 | 1 | 0 | 1 | Early | −1 |
| 0 | 1 | 0 | 1 | 1 | X | 0 |
| 0 | 1 | 1 | 1 | 0 | Late | 1 |
| 1 | 0 | 0 | 1 | 0 | Late | 1 |
| 1 | 0 | 1 | 1 | 1 | X | 0 |
| 1 | 1 | 0 | 0 | 1 | Early | −1 |
| 1 | 1 | 1 | 0 | 0 | X | 0 |

In the truth table, the quantity A⊕B represents the output of XOR2, B⊕C represents the output of XOR1 and A⊕B−B⊕C represents the phase detector output, denoted PD(t). As shown by this truth table, if the clock is late, PD(t) will vary between zero volts and the logic high value (e.g., +5V), depending on whether or not a data transition has occurred. If the clock is early, PD(t) will vary between zero volts and the negative value of the logic high voltage (e.g., −5V). Whether the clock is early or late, the average value of PD(t) over a relatively short time interval will depend on the data transition density, i.e., the number of transitions between logic 1's and logic 0's within a certain time interval. More specifically, if the function A(t) describes the average data transition density, the mean phase detector output PD(t) can be expressed as:

PD(t)=A(t)sign(φ).

where "sign" denotes the signum function and φ is the data phase, i.e., the phase difference between the symbol timing of the data signal and the VCO clock signal.

Figure 3:
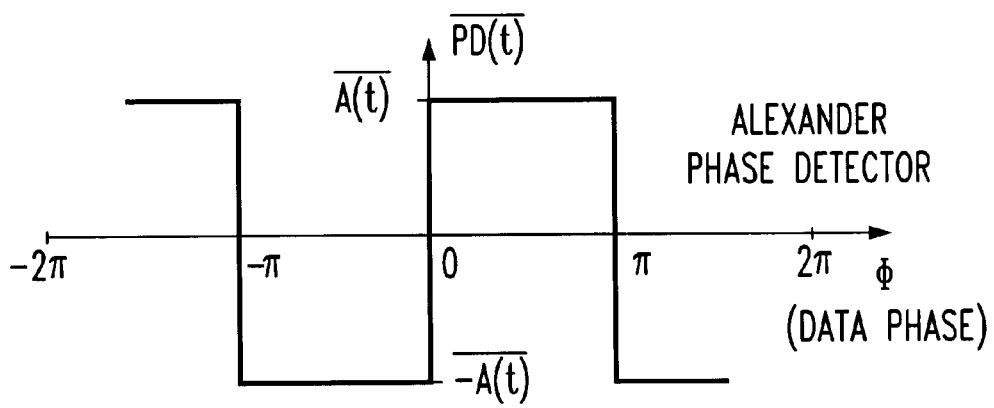
FIG. 3 is a plot of the mean phase detector output PD(t) as a function of data phase φ.

Referring to FIG. 3, the mean phase detector output PD(t) is plotted as a function of data phase φ. A late clock corresponds to the data phase in the range of 0 to π, 2π to 3π, etc. In this case, PD(t) equals the positive voltage +A(t), which is applied to VCO 16 through loop filter 14 to speed up the VCO output clock frequency towards clock alignment with the input data signal. When the clock is early (i.e., data phase in the range of −π to 0, π to 2π, etc.) PD(t) falls to −A(t). This negative voltage operates to slow the VCO clock frequency towards clock alignment. In this manner, the clock becomes self-aligned with the data signal.

Figure 4:
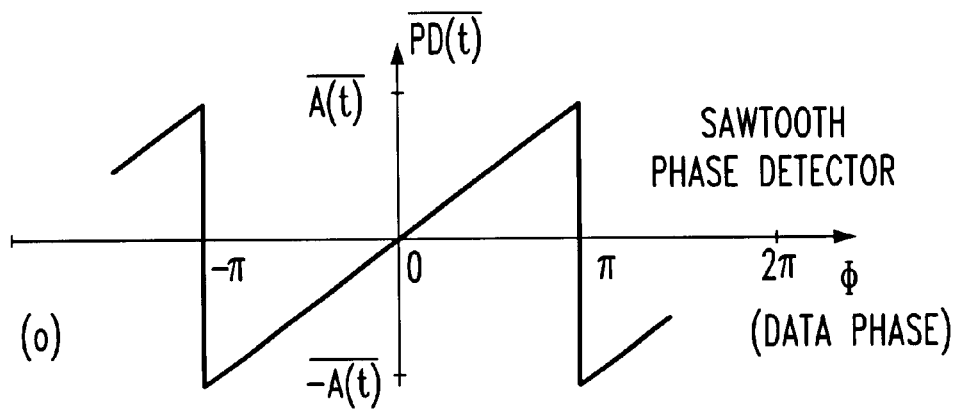
FIG. 4 illustrates an alternative sawtooth phase detector output.

While the "Alexander" phase detector has desirable self-aligning properties, it exhibits several drawbacks. First, the mean phase detector output over a given time interval PD(t) is not proportional to the magnitude of the data phase. Rather, the output is a discrete function (i.e., the signum function), as seen in FIG. 3. That is, the function PD(t) will take on only one of two values regardless of the amount of clock misalignment (for a given data transition density). This property is unlike that of a linear analog phase detector such as the sawtooth phase detector. As shown in FIG. 4, the output of a sawtooth phase detector is proportional the phase error of the clock. By contrast, the Alexander phase shifter lacks such a proportional output and thus the dynamic properties (e.g., jitter transfer, jitter tolerance) are highly dependent on the jitter distribution of the data edges, in terms of amplitude as well as frequency.

Since the Alexander phase detector detects phase information only at the zero crossings, the result is a discrete output with limited phase error information. In contrast, it has been found that by deriving phase information at additional times besides the zero crossing, a phase detector output that is substantially proportional to the local clock phase can be produced with the attendant advantages - superior phase jitter performance as well as frequency detection capability.

Figure 5:
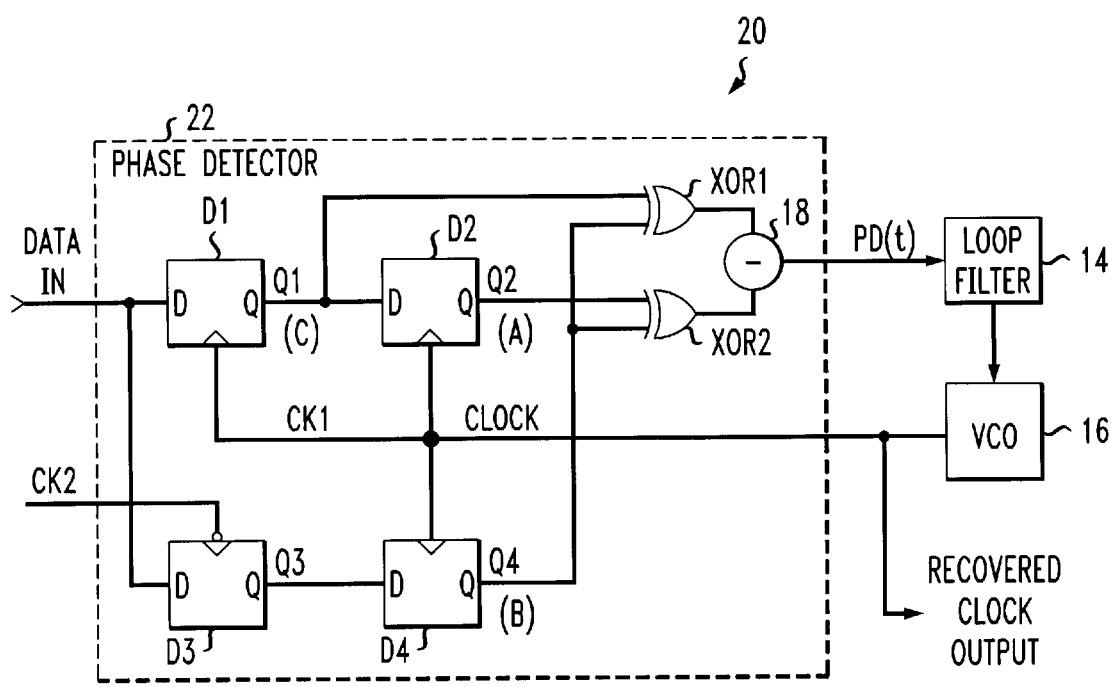
FIG. 5 illustrates an exemplary clock recovery circuit including a phase detector providing various output signals that may be used to provide frequency detection in accordance with the present invention.

A clock recovery circuit 20 that is also capable of providing frequency detection in accordance with the present invention is illustrated in FIG. 5. Clock recovery circuit 20 utilizes a modified phase detector 22, utilizing both a recovered clock signal CK1 and a second clock signal CK2, where second clock CK2 is used to generate intermediate samples (i.e., B) at times other than the zero-crossings. Similar to the arrangement discussed above, flip-flops D1 and D2 are controlled by first clock CK1 and used to generate data samples A and C. Flip-flop D3 is clocked by the second clock signal CK2 and is used to "over sample" $DATA_{IN}$ at instances other than the zero-crossing. Output Q3 from D3 is then applied as an input to flip-flop D4, which re-times this "roving" sample with clock CK1, as shown. Similar to the Alexander phase detector, gates XOR1 and XOR2 are used to determine if clock CK1 is "early" or "late". based on the values of A, B and C. In contrast to the Alexander phase detector, second clock CK2 may be derived from CK1 by modulating the phase of the latter with a periodic signal, rather than using a "binary" decision. The resulting phase detector output PD(t) is therefore a proportional function of phase, as opposed to a signum function.

Figure 6:
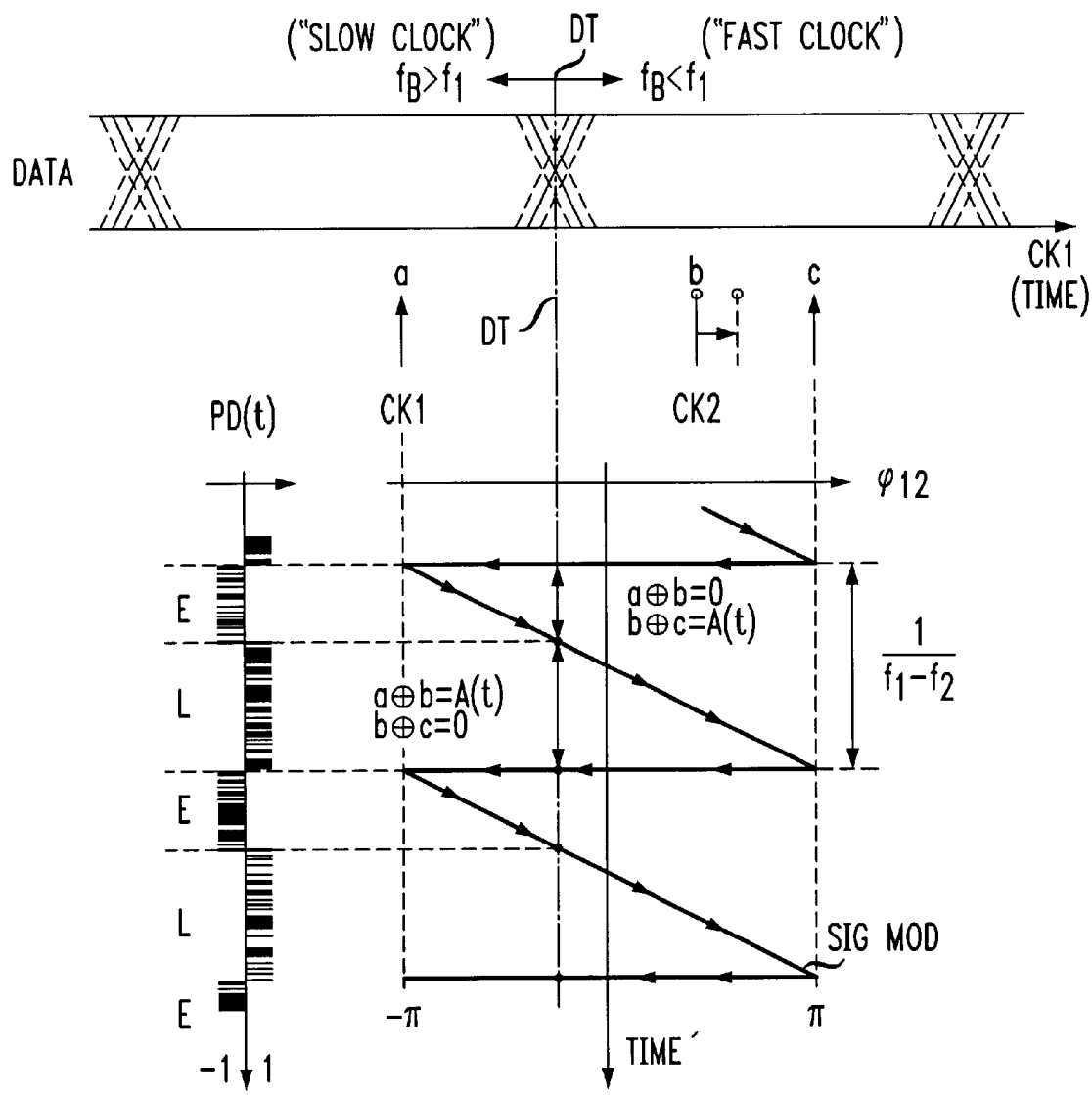
FIG. 6 is a timing diagram of the relation between "early" and "late" data signals and clock signals that may be used to derive frequency "slip" detection in accordance with the present invention.

The frequency detection potential of this arrangement, in accordance with the teachings of the present invention, is illustrated in the timing diagram of FIG. 6. As shown, the signal that modulates CK2 is assumed to be a sawtooth function, ramping from a phase of $-\pi$ to $+\pi$. It is to be noted that the phase of CK2 with respect to CK1 is monotonically decreasing at a constant rate. In effect, CK2 has a constant frequency offset with respect to CK1. Although it is not essential for the operation of the frequency detector of the present invention, clock CK2 is most likely easier to implement as a separately-generated clock of a frequency $f_2$ than as a phase-modulated version of CK1 operating at a frequency of $f_1$. Also, whether $f_1 > f_2$ or $f_2 > f_1$ is not essential. For the purposes of the present discussion, it will be assumed that $f_1 > f_2$.

The eye diagram of FIG. 6 shows the data samples, using the time base of CK1 as a reference. The eye is moving left or right, depending on the data rate $f_B$ being either greater (i.e., clock "slow") or less than (i.e., clock "fast") the frequency $f_1$ of CK1. As shown, sample B is moving right at a rate of $f_1 - f_2$. The phase difference $\phi_{12}(t)$ between CK1 and CK2 is shown on the vertical time scale (denoted time'). As long as data sample B is between A and the data transition (denoted as "DT" in FIG. 6), XOR1 will put out "down" transition pulses A(t), indicating that the clock is early, and the output of XOR2 will stay at zero. When sample B is between the data transition and sample C, the output of XOR1 stays zero and XOR2 outputs "up" transition pulses A(t), indicating that the clock is "late". Therefore, as the data transitions moves left (i.e., clock is "slow"), the number of "down" pulses from XOR1 will diminish and the number of "up" pulses from XOR2 will increase linearly with the relative phase of the data transition. Thus, in accordance with the present invention, this arrangement forms a sawtooth phase detector curve with a full $2\pi$ range.

Figure 7:
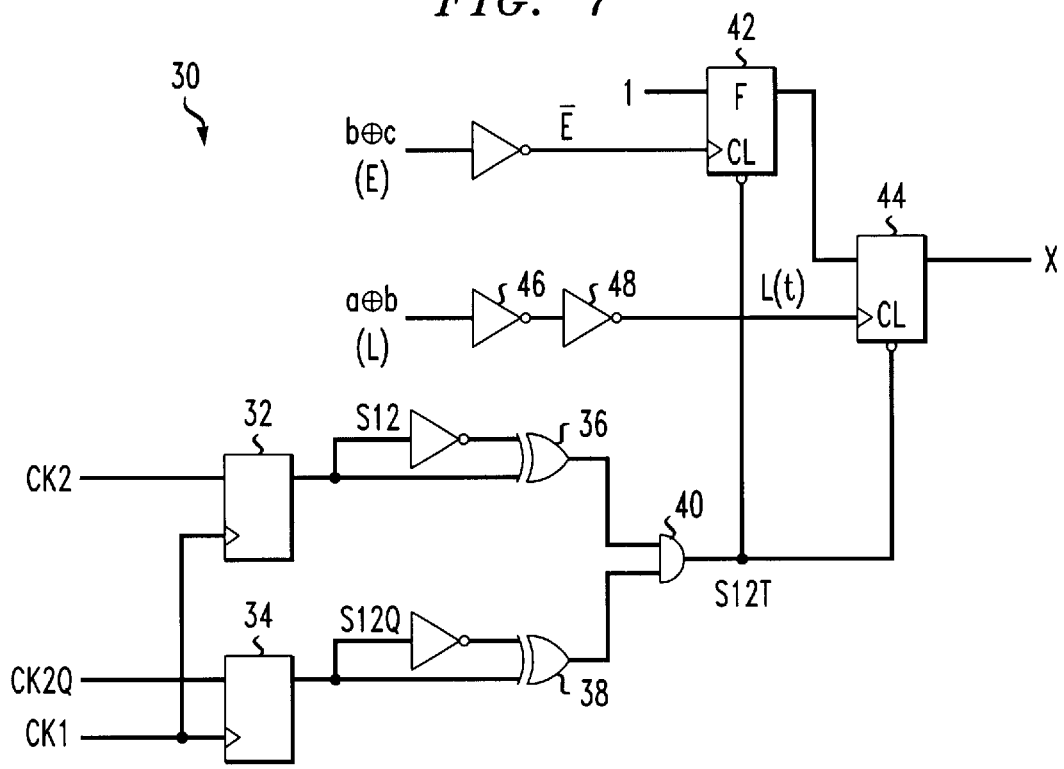
FIG. 7 illustrates an exemplary transition locator circuit of the frequency detection arrangement of the present invention.

FIG. 7 illustrates a transition locator circuit 30 of the present invention that is capable of determining the position of sample B with respect to the data transition, as required to perform the frequency detection function of the present invention. CK1 is used as the clocking input to a pair of flip-flops 32 and 34, with CK2 applied as the data input to flip-flop 32 and the quadrature of CK2 (denoted CK2Q) applied as the data input to flip-flop 34. The output of flip-flop 32 (and its inverse) are both applied as inputs to a first XOR gate 36 and provide a first quadrature subclock S12 that generates two pulses during the clocking system. Similarly, the output of flip-flop 34 (and its inverse) are applied as inputs to a second XOR gate 38 to generate a remaining pair of subclock pulses S 12Q that are in quadrature to the pulses from first XOR gate 36. Combining these pulses in a NAND gate 40 yields a train of four subclock pulses, denoted S12T, related to the original clock CK1. In accordance with the present invention, pulses S12T are used at the beginning of each quadrant, to clear out previous "early" and "late" values and help in determining the "cycle" slip between quadrants. In particular, subclock S12T is provided as the clock input to a flip-flop 42. A first input to flip-flop 42 is held at the logic "1" level, and the remaining input is (an inverted version of) the output of XOR2 of clock recovery circuit 20. As discussed above, the output of XOR2 is the combination of data samples B and C, and when this output has the logic "1" value, indicates that the data is "early" with respect to the clock. In transition circuit 30, therefore, when there is a "1" present at this input, it will be passed to the output of flip-flop 42 at the beginning of the next subclock quadrant pulse (i.e., at the next pulse of S12T). This pulse is inverted so that a falling edge is generated and passed through to the output. The falling edge output from flip-flop 42 is then applied as an input to a following flip-flop 44, also clocked by subclock S12T. As shown, the remaining input to flip-flop 44 is the output of XOR1 which indicates the presence of a "late" sample with respect to the clock. A pair of inverters 46, 48 are included in this signal path to insure that this pulse arrives at flip-flop 44 after the falling edge output from flip-flop 42 has been generated. The output of second flip-flop 44, denoted as pulse X, which starts with the first late pulse to arrive at the beginning of a quadrant (as defined by subclock S12T) and ends at the start of the next quadrant, when both flip-flops 42,44 are cleared. Therefore, both the "early" and "late" pulses are always associated with the same quadrant.

Figure 8:
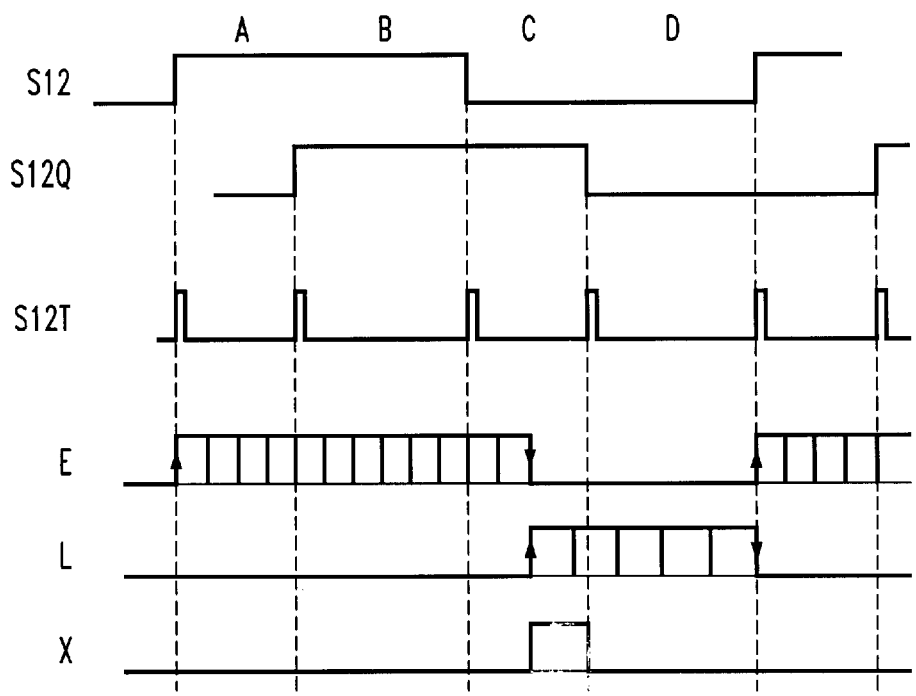
FIG. 8 contains a timing diagram of the various signals generated in the transition locator circuit of FIG. 7.
Figure 9:
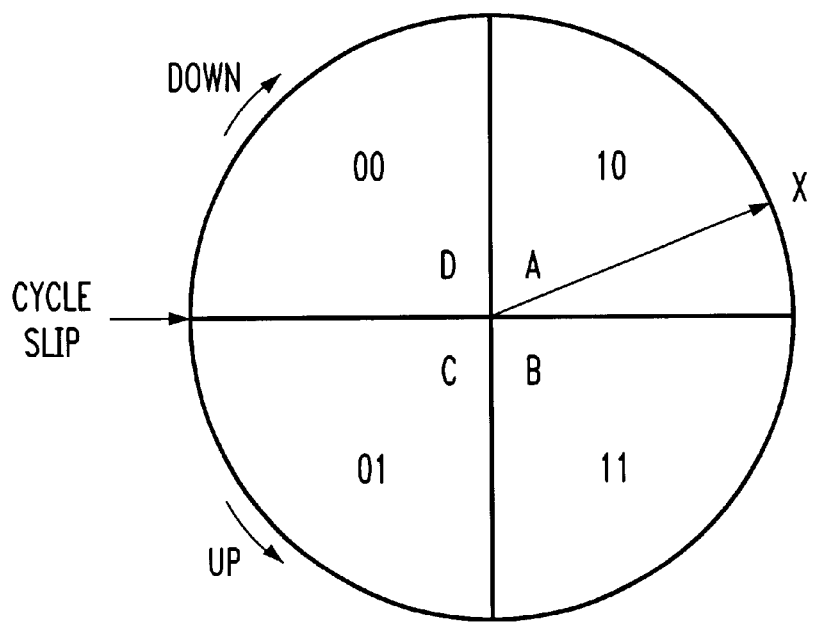
FIG. 9 contains a diagram illustrating the principle frequency cycle slip in accordance with the present invention.

FIG. 8 is a timing diagram illustrating the various pulses S12, S12Q, E, L and X as formed in transition detection circuit 30 of FIG. 7. Defining four quadrants in the clock cycle as Q1–Q4, S12T is shown as supplying a short pulse at the beginning of each quadrant. In the particular example as illustrated in FIG. 8, a "first" late transition occurs in quadrant Q3, which initiates pulse X, where X will then a positive value for the duration of this third quadrant. In accordance with the present invention, a cycle slip is defined as occurring when a data transition moves between two adjacent quadrants. FIG. 9 is a simple diagram of "cycle slip" that may be understood with reference to FIG. 8. In particular, each quadrant of the clock cycle will be associated with a unique pair of subclock signals. For this particular arrangement, quadrant Q1 is associated with subclock values S12=1, S12Q=0. Similarly quadrant Q2 is associated with S12=1, S12Q=1; quadrant Q3 is associated with S12=0, S12Q=1; and quadrant Q4 is associated with S12=0, S12Q=0. The combinational logic described below in association with FIG. 10 can then be used to generate an "up" pulse (indicating a positive cycle slip) when a transition from Q3 to Q2 occurs and generate a "down" pulse (indicating a negative cycle slip) when a transition from Q4 to Q1 occurs, where the "up" and "down" pulses are used as error correction signals for the clock recovery circuit.

Figure 10:
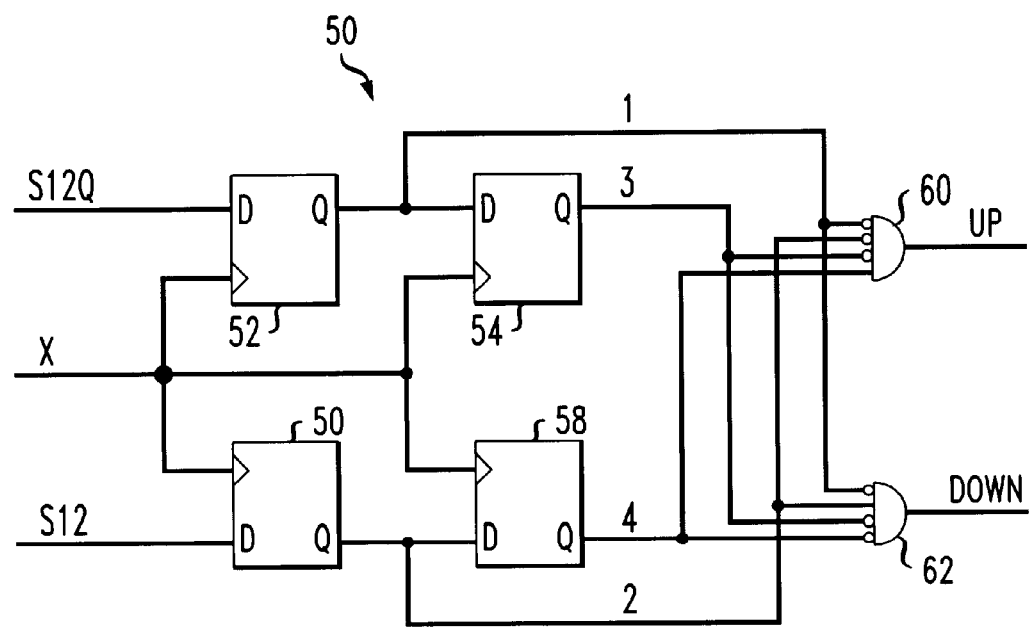
FIG. 10 illustrates an exemplary frequency cycle slip detector formed in accordance with the present invention.

A cycle slip detector 50, as shown in FIG. 10, uses the timing of the X pulses with respect to subclock S12T to determine the position of the data transition with respect to clock CK1. Defined as a rotational frequency detector, pulse stream X is supplied as the clocking input to a set of flip-flops 52, 54, 56 and 58. Subclock S12Q is applied as the D input to first flip-flop 52, and forms the first quadrant output Q1. This output then passes through second flip-flop 54 to form the third quadrant output Q3 (as controlled by the clocking rate of pulse stream X). Subclock S12 is similarly applied as the D input to flip-flop 56 to form second quadrant output Q2, where the fourth quadrant output Q4, follows as the output of flip-flop 58. Inverted values of Q1, Q2, and Q3 are combined with Q4 in a first gate 60 and used to indicate a "positive" cycle and the need to increase the frequency, as described above. A second gate 62, responsive to inverted values of Q1, Q3, Q4 and the value of Q2 is used to generate a "down" frequency slip signal.

Figure 11:
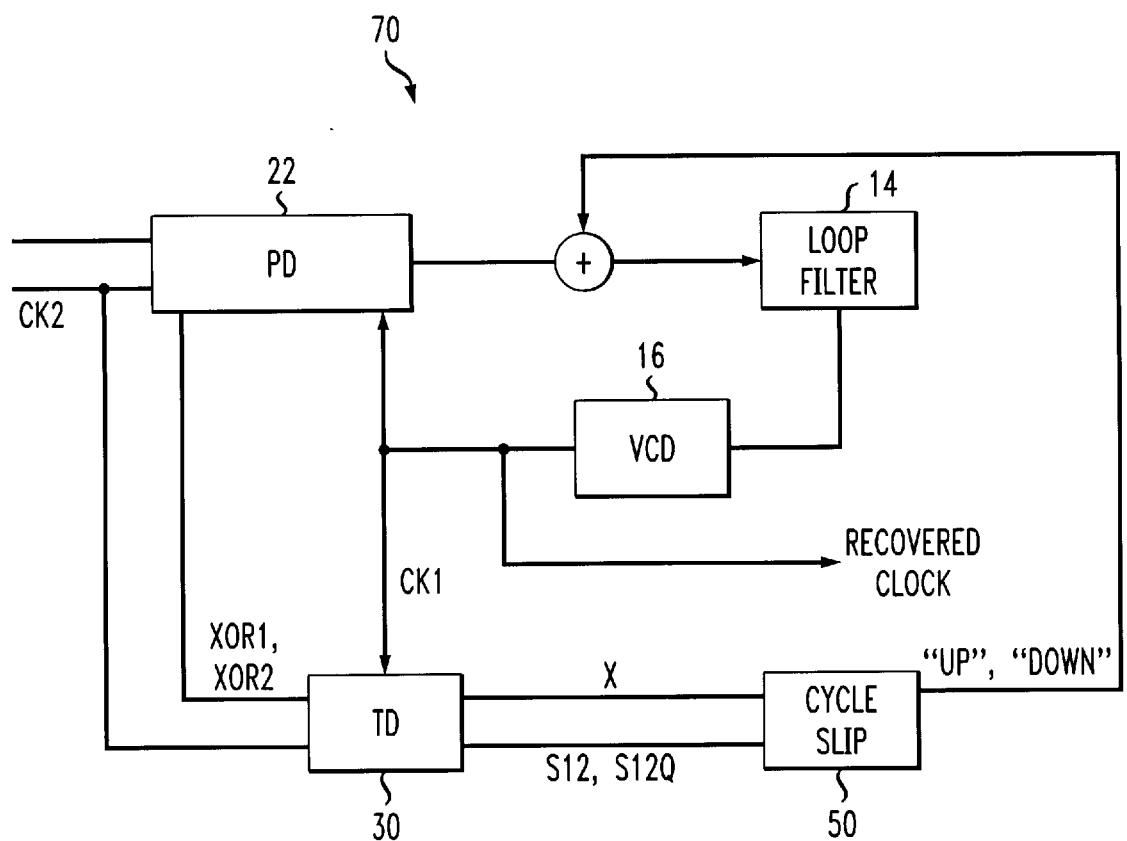
FIG. 11 is a block diagram of a clock recovery circuit providing both phase detection and frequency detection in accordance with the present invention.

FIG. 11 illustrates an exemplary self-aligned clock recovery circuit 70 of the present invention, showing in block diagram form the various components described in detail above, namely, phase detector 22, transition detector 30 and cycle slip detector 50. As shown, the final frequency slip pulses "up" and "down" from cycle slip detector 50 are fed back to an adder 72 to be combined with the output from phase detector 22 as shown. Thus, the arrangement as shown in FIG. 11 is capable of providing frequency detection within a phase detector circuit arrangement.

While the present invention has been described above with reference to specific embodiments thereof, it is understood that one skilled in the art may make many modifications to the disclosed embodiments without departing from the spirit and scope of the invention. For example, while the illustrative embodiment is designed to receive an input data signal comprise of a bit stream (binary data), it may be modified to enable synchronization with an input data signal having a non-binary symbol stream. As another example, the various logic circuits within the phase detector, transition detector and cycle slip detector may be formed of alternative combinations of logic gates, as long as the proper combinational logic is provided. Accordingly, these and other modifications are intended to be included within the spirit and scope of the present invention as defined by the claims appended hereto.

What is claimed is:

1. A clock recovery circuit for synchronizing a first, local clock signal from a local clock generator with the symbol-to-symbol timing of an input data signal and providing a recovered clock signal using both phase detection and frequency detection, the circuit comprising a phase detector responsive to the input data signal for producing an output voltage that is proportion to the phase difference between the input data signal and a generated ac control signal;

a loop filter responsive to the output from the phase detector for integrating the output of said phase detector and creating a voltage-controlled oscillator control signal; and a voltage-controlled oscillator responsive to the output from the loop filter for generating the ac control signal, which is fed back to said phase detector and provided as the recovered clock output signal from said clock recovery circuit, wherein said phase detector comprises a clock generator for generating a second clock signal exhibiting a random phase with respect to said first, local clock signal;

sampling circuitry responsive to the input data signal for producing first and second samples of said data signal during first and second pulses of said first, local clock signal and producing a data crossover sample of said data signal during a transition of said second clock signal;

first logic circuitry responsive to said first and second samples and said data crossover sample for determining when a recovered clock signal is "early" or "late", based upon the position of said data crossover sample when compared with the first and second samples and generating as an output either an "early" output signal or a "late" output signal, as appropriate;

transition detector circuitry responsive to the "early" and "late" output signals from the first logic circuitry and also the first, local clock signal and second generated clock signal for generating a set of subclock quadrant pulses and determining a transition between a last "early" pulse and a first "late" pulse during a quadrant, providing as an output a pulse indicative of each transition; and frequency cycle slip detector circuitry responsive to the transition output pulse and the set of subclock quadrant pulses from the transition detector circuitry and including second logic circuitry to determine, based on the relationship between the transition pulses and the subclock quadrant pulses, when the recovered clock frequency should be adjusted "up" or "down" and generating as an output either an "up" output signal or a "down" output signal, as appropriate, the clock recovery circuit further comprising an adder disposed in the signal path between the phase detector and the loop filter, the adder responsive to the output from the phase detector and the "up", "down" output signal pulses from the frequency cycle slip detector, for adjusting the frequency of the phase detector output "up" or "down", accordingly, prior to applying the phase detector output as an input to the loop filter.

2. The clock recovery circuit of claim 1 wherein the transition detector comprises a first logic circuit responsive to both the local clock and the second clock for generating therefrom the set of subclock pulses including a first pair of subclock pulses based on a combination of said local and second clocks and a second pair of subclock pulses based on a combination of a quadrature version of the second clock and the local clock, the first and second pairs of subclocks forming the set of subclock pulses such that there is a pulse at the start of each clock quadrant; and a sampling circuit responsive to the "early" and "late" pulses generated by the phase detection circuit and clocked by a stream of subclock pulses generated by the first logic circuit, the sampling circuit generating as an output a transition pulse for each quadrant, the transition pulse indicative of the timing between the last "early" pulse and the first "late" pulse during each quadrant.

3. The clock recovery circuit as defined in claim 2 wherein the transition detector first logic circuit comprises a first flip-flop having the second clock signal as a data input and the local clock signal as the clock input, generating as an output a second clock pulse at the local clock rate;

a second flip-flop having a quadrature version of said second clock signal as a data input and the local clock signal as the clock input, generating as an output a quadrature second clock pulse at the local clock rate;

a first exclusive-OR gate having as inputs the output from said first flip-flop and an inverted value of said output from said first flop-flop, the output from said first exclusive-OR gate defined as the first pair of subclock pulses;

a second exclusive-OR gate having as inputs the output from said second flip-flop and an inverted value of said output from said second flip-flop, the output from said second exclusive-OR gate defined as the second pair of subclock pulses; and a combiner for combining the first and second pairs of subclock pulses into a subclock pulse stream, said subclock pulse stream applied as the clock input to transition detector sampling circuit.

4. The clock recovery circuit as defined in claim 2 wherein the sampling circuit comprises a first flip-flop having a logic "1" as a first input and the "early" pulse from the phase detector circuit as a second input, said first flip-flop clocked by the stream of subclock pulses from the first logic circuit, said first flip-flop thus generating as an output the logic "1" value when an "early" pulse is received during a subclock period; and a second flip-flop having as inputs the logic "1" output from the first flip-flop and a delayed version of the "late" pulse output from the phase detector circuit, said second flip-flop clocked by the stream of subclock pulses from said first logic circuit, said second flip-flop thus generating as an output a transition pulse indicative of the delay between the last "early" pulse and the first "late" pulse during a subclock quadrant time period.

5. The clock recovery circuit as defined in claim 4 wherein the sampling circuit further comprises a pair of inverters disposed in the "late" pulse signal path prior to the input to the second flip-flop to provide for the desired delay.

6. The clock recovery circuit as defined in claim 1 wherein the frequency cycle slip detector comprises a first logic circuit responsive to the transition pulse output from the transition detection circuit and the first and second pair of subclock pulses to generate a set of four quadrant data samples; and a second logic circuit responsive to a predetermined combination of the set of four quadrant data samples to generate as an output the "up" pulse indicative of a positive frequency cycle slip and the "down" pulse indicative of a negative frequency cycle slip.

7. The clock recovery circuit as defined in claim 6 wherein the first logic circuit comprises a first flop-flop responsive at its data input to the first pair of subclock pulses and clocked by the transition pulse output from transition detector circuit, for generating a first quadrant data sample;

a second flip-flop responsive at its data input to the output from said first flip-flop and clocked by said transition pulse output, for generating a third quadrant data sample;

a third flip-flop responsive at its data input to the second pair of subclock pulses and clocked by said transition pulse output, for generating a second quadrant data sample; and a fourth flip-flop responsive at its data input to the output from said third flip-flop and clocked by said transition pulse, for generating a fourth quadrant data sample.

8. The clock recovery circuit as defined in claim 6 wherein the second logic circuit comprises a first AND gate responsive to inverted values of the first, second and third quadrant data samples and the fourth quadrant data sample for generating an "up" pulse output when all four input values are at a logic "1" level; and a second AND gate responsive to inverted values of the first, third and fourth quadrant data samples and the second data sample for generating a "down" pulse output when all four input values are at a logic "1" level.

9. An integrated circuit comprising a clock recovery circuit for synchronizing a local clock of a local clock generator with symbol timing of an input data signal and providing both phase detection and frequency detection, the clock recovery circuit comprising an arrangement for generating a second clock having a random phase with respect to the local clock;

sampling circuitry for obtaining first and second samples of said data signal during first and second pulses of said local clock, and for obtaining a data crossover sample of said data signal during a transition of said second clock;

first logic circuitry responsive to said first and second data samples and said data crossover sample for determining if a recovered clock signal is "early" or "late", based upon the value of said data crossover sample when compared with the first and second data samples;

transition detector circuitry responsive to the "early" and "late" output signals from the first logic circuitry and also the local clock for generating a set of subclock quadrant pulses and determining a transition between a last "early" pulse and a first "late" pulse during a quadrant, providing as an output pulses indicative of each transition; and frequency cycle slip detector circuitry responsive to the transition output pulses and the subclock from the transition detector circuitry and including second logic circuitry to determine, based on the relationship between the transition pulses and the subclock, if the frequency should be adjusted "up" or "down".

10. The integrated circuit of claim 9 wherein the transition detector comprises a first logic circuit responsive to both the local clock and the second clock for generating therefrom the set of subclock pulses including a first pair of subclock pulses based on a combination of said local and second clocks and a second pair of subclock pulses based on a combination of a quadrature version of the second clock and the local clock, the first and second pairs of subclocks forming the set of subclock pulses such that there is a pulse at the start of each clock quadrant; and a sampling circuit responsive to the "early" and "late" pulses generated by the phase detection circuit and clocked by a stream of subclock pulses generated by the first logic circuit, the sampling circuit generating as an output a transition pulse for each quadrant, the transition pulse indicative of the timing between the last "early" pulse and the first "late" pulse during each quadrant.

11. The integrated circuit as defined in claim 10 wherein the transition detector first logic circuit comprises a first flip-flop having the second clock signal as a data input and the local clock signal as the clock input, generating as an output a second clock pulse at the local clock rate;

a second flip-flop having a quadrature version of said second clock signal as a data input and the local clock signal as the clock input, generating as an output a quadrature second clock pulse at the local clock rate;

a first exclusive-OR gate having as inputs the output from said first flip-flop and an inverted value of said output from said first flop-flop, the output from said first exclusive-OR gate defined as the first pair of subclock pulses;

a second exclusive-OR gate having as inputs the output from said second flip-flop and an inverted value of said output from said second flip-flop, the output from said second exclusive-OR gate defined as the second pair of subclock pulses; and a combiner for combining the first and second pairs of subclock pulses into a subclock pulse stream, said subclock pulse stream applied as the clock input to transition detector sampling circuit.

12. The integrated circuit as defined in claim 10 wherein the sampling circuit comprises a first flip-flop having a logic "1" as a first input and the "early" pulse from the phase detector circuit as a second input, said first flip-flop clocked by the stream of subclock pulses from the first logic circuit, said first flip-flop thus generating as an output the logic "1" value when an "early" pulse is received during a subclock period; and a second flip-flop having as inputs the logic "1" output from the first flip-flop and a delayed version of the "late" pulse output from the phase detector circuit, said second flip-flop clocked by the stream of subclock pulses from said first logic circuit, said second flip-flop thus generating as an output a transition pulse indicative of the delay between the last "early" pulse and the first "late" pulse during a subclock quadrant time period.

13. The integrated circuit as defined in claim 12 wherein the sampling circuit further comprises a pair of inverters disposed in the "late" pulse signal path prior to the input to the second flip-flop to provide for the desired delay.

14. The integrated circuit as defined in claim 9 wherein the frequency cycle slip detector comprises a first logic circuit responsive to the transition pulse output from the transition detection circuit and the first and second pair of subclock pulses to generate a set of four quadrant data samples; and a second logic circuit responsive to a predetermined combination of the set of four quadrant data samples to generate as an output the "up" pulse indicative of a positive frequency cycle slip and the "down" pulse indicative of a negative frequency cycle slip.

15. The integrated circuit as defined in claim 14 wherein the first logic circuit comprises a first flop-flop responsive at its data input to the first pair of subclock pulses and clocked by the transition pulse output from transition detector circuit, for generating a first quadrant data sample;

a second flip-flop responsive at its data input to the output from said first flip-flop and clocked by said transition pulse output, for generating a third quadrant data sample;

a third flip-flop responsive at its data input to the second pair of subclock pulses and clocked by said transition pulse output, for generating a second quadrant data sample; and a fourth flip-flop responsive at its data input to the output from said third flip-flop and clocked by said transition pulse, for generating a fourth quadrant data sample.

16. The integrated circuit as defined in claim 14 wherein the second logic circuit comprises a first AND gate responsive to inverted values of the first, second and third quadrant data samples and the fourth quadrant data sample for generating an "up" pulse output when all four input values are at a logic "1" level; and a second AND gate responsive to inverted values of the first third and fourth quadrant data samples and the second data sample for generating a "down" pulse output when all four input values are at a logic "1" level.

* * * * *